United States Patent [19]
Takatani et al.

[11] Patent Number: 5,399,230
[45] Date of Patent: Mar. 21, 1995

[54] METHOD AND APPARATUS FOR ETCHING COMPOUND SEMICONDUCTOR

[75] Inventors: Shinichiro Takatani, Koganei; Takeshi Kikawa, Kokubunji; Chushirou Kusano, Tokorozawa; Masatoshi Nakazawa, Koganei, all of Japan

[73] Assignee: Hitachi, Ltd., Tokyo, Japan

[21] Appl. No.: 72,407

[22] Filed: Jun. 7, 1993

[30] Foreign Application Priority Data

Jun. 5, 1992 [JP] Japan .................. 4-145401

[51] Int. Cl.6 .................................. B44C 1/22
[52] U.S. Cl. .................. 156/628; 156/635; 156/662
[58] Field of Search ............... 156/635, 628, 643, 345, 156/662; 148/DIG. 65

[56] References Cited

U.S. PATENT DOCUMENTS

| | | | |
|---|---|---|---|
| 4,361,461 | 11/1982 | Chang | 156/643 |
| 4,734,152 | 3/1988 | Geis | 156/646 |
| 4,830,705 | 5/1989 | Loewenstein | 156/643 |
| 4,994,140 | 2/1991 | Kenzo | 156/643 |
| 5,034,092 | 7/1991 | Lebby | 156/646 |
| 5,110,765 | 5/1992 | Bilakanti | 437/225 |
| 5,145,554 | 9/1992 | Seki | 156/643 |

FOREIGN PATENT DOCUMENTS

| | | |
|---|---|---|
| 61-183923 | 8/1986 | Japan . |
| 2-213130 | 8/1990 | Japan . |
| 2-220436 | 9/1990 | Japan . |
| 3-110844 | 5/1991 | Japan . |

OTHER PUBLICATIONS

Hiroyuki "Atomic Layer Controlled Digital Etching of Silicon" Japanese Journal of Applied Physics vol. 29, No. 11, Nov. 1990 pp. 2648-2652.

*Primary Examiner*—R. Bruce Breneman
*Assistant Examiner*—Joni Y. Chang
*Attorney, Agent, or Firm*—Antonelli, Terry, Stout & Kraus

[57] ABSTRACT

A compound semiconductor is etched by a step of substituting a composite element of a compound semiconductor with other element, thereby forming a compound layer on the surface of the compound semiconductor and a step of removing the compound layer from the surface. Etching depth is controlled not by etching time, but by the number of runs (repetitions) of the etching step, and thus can be precisely controlled.

28 Claims, 16 Drawing Sheets

FIG. IA
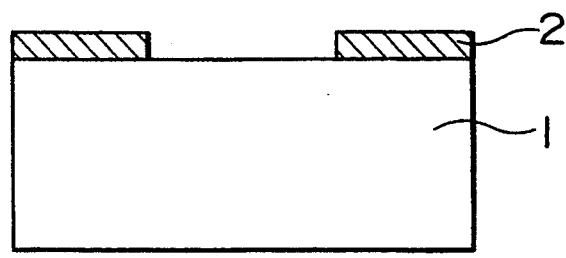
FIG. IB
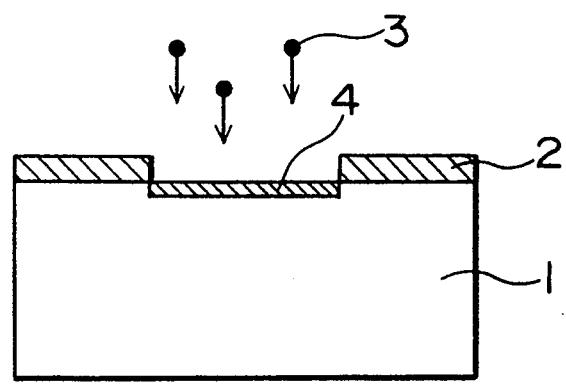
FIG. IC
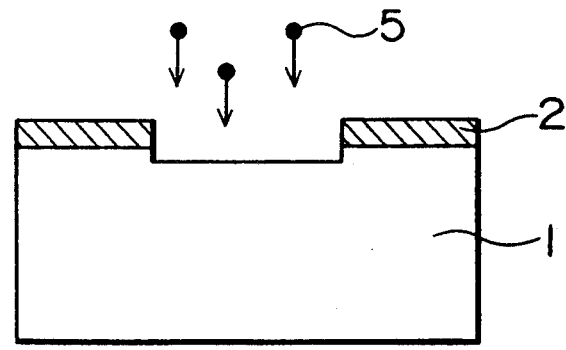

METHOD AND APPARATUS FOR ETCHING COMPOUND SEMICONDUCTOR

BACKGROUND OF THE INVENTION

1) Field of the Invention

The present invention relates to a method and an apparatus for etching a compound semiconductor in the production of semiconductor devices, and particularly to a method for etching a compound semiconductor under precise control of etching depth.

2) Related Art

With recent requirements for making semiconductor devices it has been proposed to etch semiconductors precisely in the order of thickness of a few monoatomic layers. For example, according to a method disclosed in JP-A 3-110844, a step of adsorbing chlorine as a reactive gas on the surface of GaAs as one of compound semiconductors, and a step of energizing the surface by irradiation with charged particle beams, thereby occasioning reactions and desorbing the reaction products from the surface are repeated alternately, where the etching depth can be controlled by selecting number of repetitions of these two etching steps and precise etching in the order of thickness of a few monoatomic layers can be obtained.

Other known methods for desorbing the reaction products include a method for highly evacuating an etching chamber (JP-A 2-213130) and a method for heating a semiconductor substrate to a high temperature (JP-A 2-220436). Another example of controlling an etching depth by repetitions of etching steps is a method for repeating a step of heating silicon as one of semiconductors in an oxidizing atmosphere, thereby forming an oxide film on the surface and a step of removing the oxide film by etching with a hydrofluoric acid solution (JP-A 61-183923).

In the foregoing methods disclosed in JP-A 3-110844, JP-A 2-213130 and JP-A 2-220436, it is utilized to interrupt adsorption of the reactive gas on the semiconductor surface in a thickness level of a monoatomic layer to make constant the amount of the semiconductor to be removed by one run of the etching steps. However, the amount of the reactive gas to be adsorbed can be no more than that for the thickness of a monoatomic layer in that case and thus the etching depth obtained by one run of the etching steps will be less than the thickness of a monomolecular layer. Monomolecular layer corresponds, in case of gallium arsenide, to the total thickness of a monolayer of gallium and a monolayer of arsenic. For example, when chlorine (Cl) is adsorbed onto the gallium arsenide (100) surface, the arsenic chloride having a higher vapor pressure will be desorbed immediately after its formation, whereas the gallium chloride cannot be desorbed due to its relatively low vapor pressure. As a result, a monolayer of chlorine atoms is adsorbed on the gallium surface. Then, the chlorine is subjected to reaction with gallium, where the reaction product is $GaCl_3$. That is, three chorine atoms are required for one gallium atom, and only one-third of the monoatomic layer of gallium can be removed by one run of the etching steps. Thus, only two-thirds of the monoatomic layer of gallium arsenide can be removed by one run of the etching steps and the etching depth by one run of the etching steps will be less than the thickness of a monomolecular layer. In the ordinary process for producing semiconductors, at least centi (100)-molecular layer must be removed in most cases, and thus there is such a problem as a necessity for carrying out too many runs of the etching steps.

In the method disclosed in the foregoing JP-A 61-183923 the amount of semiconductor to be removed by one run of the etching steps can be made more than the monoatomic layer thickness (monomolecular layer thickness in case of compound semiconductor) by increasing the thickness of oxide film layer. However, the oxygen atom is considerably smaller than any of semiconductor constituent atoms, and thus the oxidation reaction of semiconductor proceeds by faster internal diffusion taking place along the interstitical sites. That is, it is difficult to control the thickness of oxide film and thus it is difficult continuously to obtain an oxide film having a constant thickness. Thus, there is such a problem that the amount of semiconductor to be removed by one run of the etching steps is liable to fluctuate.

SUMMARY OF THE INVENTION

An object of the present invention is to provide a novel method and a novel apparatus for etching a compound semiconductor, which can overcome the problems of the conventional art.

The object of the present invention can be attained by repeating a step of substituting at least one constituent element of a compound semiconductor with another element, thereby forming the resulting compound layer on the surface of the compound semiconductor and a step of selectively removing the thus formed compound layer from the surface.

BRIEF DESCRIPTION OF THE DRAWINGS

FIGS. 1A to 1C are cross-sectional views showing etching steps according to Example 1 of the present invention.

DETAILED DESCRIPTION OF THE PREFERRED EMBODIMENTS

Figure 2A:
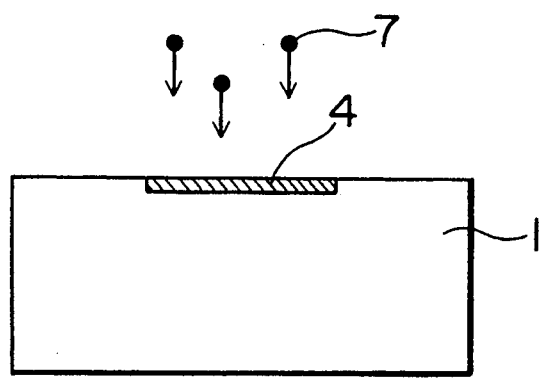
FIGS. 2A and 2B are cross-sectional views showing etching steps according to Example 2 of the present invention.

In case of etching a compound semiconductor, for example, of Groups III and V of the periodic table as an etching sample, the surface of the etching sample is exposed to any one of selenium molecular beams, selenide gases (for example, hydrogen selenide gas), their energetical beams, and a solution containing selenium to form a Group III element selenide layer on the surface of the etching sample, and then the selenide layer is selectively removed therefrom. Or, the surface of the etching sample is exposed to any one of sulfur molecular beams, sulfide gases (for example, hydrogen sulfide gas), their energetical beams, and a solution containing sulfur to form a Group III element layer sulfide on the surface of the etching sample and then the sulfide layer is selectively removed therefrom. Or, the surface of the etching sample is exposed to any one of tellurium molecular beams, telluride gases (for example, hydrogen telluride), their energetic beams, and a solution containing tellurium to form a Group III element tellulide layer on the surface of the etching sample and then the telluride layer is selectively removed therefrom. Selective removal of the selenide layer, sulfide layer or telluride layer can be carried out with reducing radical beams or gases such as a hydrogen radical gas, etc., their energetical beams or electron beams.

The object of the present invention can be attained by an etching apparatus, which comprises a vacuum chamber, a means of supporting a sample placed in the vacuum chamber, a means of supplying an element capable of substituting a constituent element of compound semiconductor as a sample with another element, thereby forming a compound layer, and a means of removing the compound layer from the surface. Specifically, the etching apparatus for the practice of the present invention includes (1) an etching apparatus, which comprises a vacuum chamber, a means of supporting a sample placed in the vacuum chamber, a crucible and a cracking cell, (2) an etching apparatus, which comprises a vacuum chamber, a means of supporting a sample placed in the vacuum chamber, and a plurality of cracking cells, at least one of the cracking cells being a cracking cell based on electron beam heating, (3) an etching apparatus, which comprises a vacuum chamber, a means of supporting a sample placed in the vacuum chamber, a focussed ion source, and a cracking cell, and (4) an etching apparatus, which comprises a vacuum chamber, a means of supporting a sample placed in the vacuum chamber, an electron beam source and a cracking cell.

Working principle of the present invention will be explained below, referring to etching of gallium arsenide as an example of compound semiconductor. When the surface of gallium arsenide is irradiated with selenium molecular beams, a $Ga_2Se_3$ compound layer is formed on the surface of gallium arsenide to a thickness of approximately a bimolecular layer. The $Ga_2Se_3$ compound layer has the same crystalline structure as that of gallium arsenide and is formed by substitution reaction of arsenic with selenium on the surface of gallium arsenide. The thickness of the $Ga_2Se_3$ compound layer is always that of approximately a bimolecular layer, substantially independent of irradiation time of selenium molecular beams and surface temperature.

In case of forming a compound on the surface by substitution of a constituent element of compound semiconductor with another element, it has been found that the substitution reaction will not proceed deeply into the semiconductor. That is, the amount of the semiconductor to be removed by one run of the etching steps can be readily controlled to a constant etching depth. Furthermore, more atoms than those required for the monoatomic layer can react with the semiconductor by the substitution reaction, and thus the amount of the semiconductor to be removed by one run of the etching steps can be made equal to or more than the etching depth of monoatomic layer.

In case of selenizing the surface of gallium arsenide as in the foregoing example, the selenizing treatment can be carried out by exposing the surface of the sample not only to the above-mentioned selenium molecular beams, but also to a selenide gas (for example, hydrogen selenide gas), its energetical beams or a solution containing selenium, whereby substitution reaction of the Group V element with selenium atoms can take place. As a result, the Group V element is desorbed from the surface, whereas the Group III element reacts with selenium atoms to form a selenide layer. Since the selenide layer has a lower vapor pressure, reaction with reducing radicals such as hydrogen radicals or a hydrogen gas or their energetical beams is necessary for the desired desorption of the selenide from the surface. Or, the selenide can be removed from the surface by energizing the surface by electron beams. By repetitions of the etching steps the compound semiconductor can be etched precisely to a depth of a few monoatomic layers. This can be also applied to cases of sulfurizing or tellurizing the surface of compound semiconductors.

EXAMPLE 1

Etching of gallium arsenide will be explained in this Example, referring to FIGS. 1A to 1C.

A solid layer 2 of silicon oxide or the like having openings is provided at desired positions on a semiconductor substrate 1 (FIG. 1A). Then, the surface is irradiated with selenium molecular beams 3 at a substrate temperature of about 400° C., whereby substitution reaction takes place on the surface between arsenic as a constituent element of the substrate compound semiconductor and selenium to form a compound layer 4 composed mainly of gallium selenide on the surface (FIG. 1B). Then, the surface is irradiated with hydrogen radicals 5, whereby the hydrogen radicals 5 react with the compound layer 4 to form a hydride, which is desorbed from the surface. That is, the compound layer 4 is removed thereby (FIG. 1C). Hydrogen radicals can be formed, for example, by contacting a hydrogen gas with tungsten heated to about 2,000° C., thereby cracking hydrogen molecules into hydrogen radicals, or by using an ECR (electron cyclotron resonance) plasma source, which comprises accelerating electrons in a magnetic field to take a cyclotronic motion and allowing the accelerated electrons to hit hydrogen gas molecules. By alternately conducting a step of irradiation with selenium molecular beams to form a compound layer and a step of removing the compound layer by hydrogen radicals, the semiconductors in the openings of the solid layer 2 can be etched to a desired depth.

Figure 6:
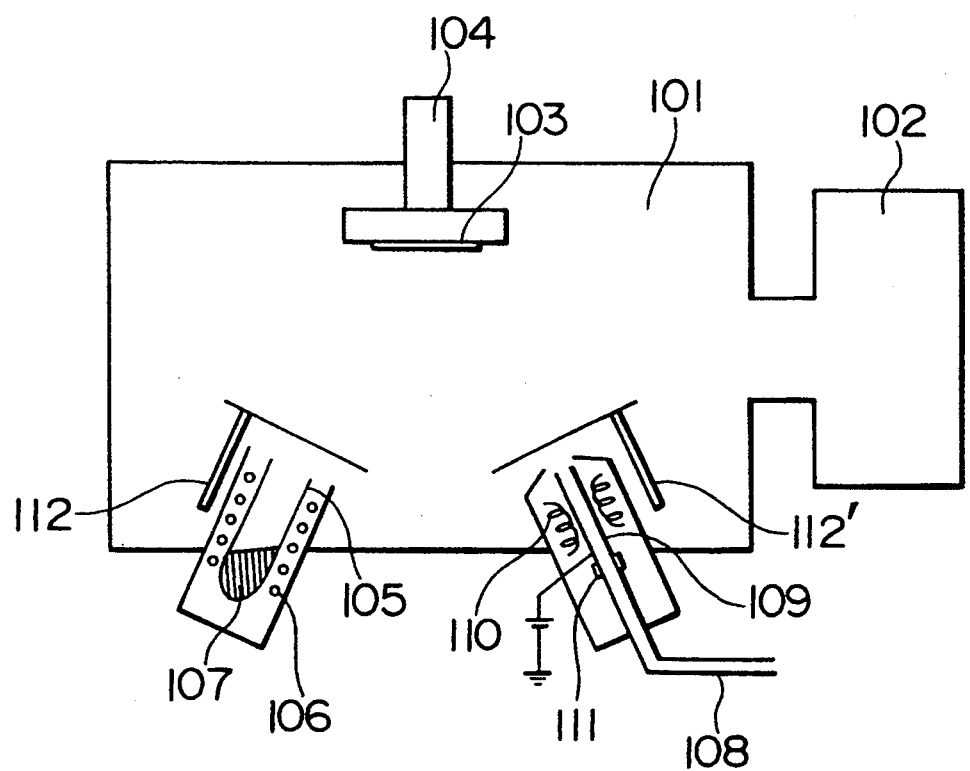
FIG. 6 is a schematic view showing one example of an etching apparatus for the practice of the present invention.

The etching apparatus used for the foregoing etching method is schematically shown in FIG. 6, where numeral 101 shows a vacuum chamber, 102 an evacuating unit, 103 a semiconductor substrate and 104 a substrate support. Selenium molecular beams can be obtained by heating solid selenium 107 filled in a crucible 105 by a heater 106. The intensity of the molecular beams can be controlled by adjusting the crucible temperature. Hydrogen radicals can be formed by passing a hydrogen gas through a tungsten pipe 109 heated to 1,600° C. or higher, thereby dissociating the hydrogen molecules into an atomic state on the inside wall of the pipe. Heating of the tungsten pipe 109 is carried out by applying a high voltage (e.g. about 2 kV) to the pipe itself and allowing thermoelectrons emitted from a filament 110 to hit the pipe under an accelerated state. Numeral 108 shows a gas inlet pipe. The tungsten pipe 109 is electrically isolated from the gas inlet pipe 108 by an insulator 111. Hydrogen radicals can be also formed by accelerating electrons in a magnetic field into a cyclotronic motion and allowing the accelerated electrons to hit the hydrogen gas molecules. Switching a selenium molecular beams to hydrogen radical beams or vice versa can be alternately by opening or closing shutters 112 and 112'.

During the irradiation of gallium arsenide with selenium molecular beams, arsenic liberated by the substitution reaction of arsenic with selenium is desorbed in the form of arsenic molecules or arsenic selenide molecules, whereas the compound layer composed of gallium selenide is not desorbed. The substitution reaction is interrupted when the thickness of the compound layer composed of gallium selenide reaches approximately that of bimolecutar layer. That is, the substitution reaction has the so called self-limiting mechanism. Hydrogen radicals can remove the compound layer comprised of gallium selenide, but substantially do not react with gallium arsenide. With sufficient irradiation with the selenium molecular beams or hydrogen radicals, the amount of gallium arsenide to be removed by one run of the etching steps thus always corresponds to the thickness of approximately a bimolecular layer (5 to 6 Å), independent on the irradiation time, and the etching depth can be precisely controlled by properly selecting the number of repetitions (runs) of the etching steps.

The amount of gallium arsenide to be removed by one run of the etching steps can be controlled by changing the substrate temperature, irradiation dosage of selenium molecular beams, etc., or irradiation dosage of hydrogen radicals, etc. In case of changing the irradiation dosage of hydrogen radicals, a portion of gallium selenide can be removed. Furthermore, the number of repetitions (runs) can be considerably decreased, as compared with the conventional etching process based on adsorption of chlorine gas. Still furthermore, ions of higher energy level are not used in the etching, and thus damages of semiconductor are less than those encountered in case of the reactive ion etching so far often employed.

In the foregoing explanation, selenium molecular beams are used to form a compound layer composed of a selenide on the surface of semiconductor. Selenide gases such as hydrogen selenide gas, diethyl selenide gas, etc., gases obtained by cracking of these gases, or their energetical beams can be likewise employed. Or, the compound semiconductor substrate can be exposed to a solution containing selenium, for example, an aqueous solution of alkali selenide to form a compound layer. The compound layer composed of selenide can be carried out not only with the hydrogen radicals, but also with such reducing gases as a hydrogen gas, a chloride gas, etc., or their energetical beams.

Figure 7:
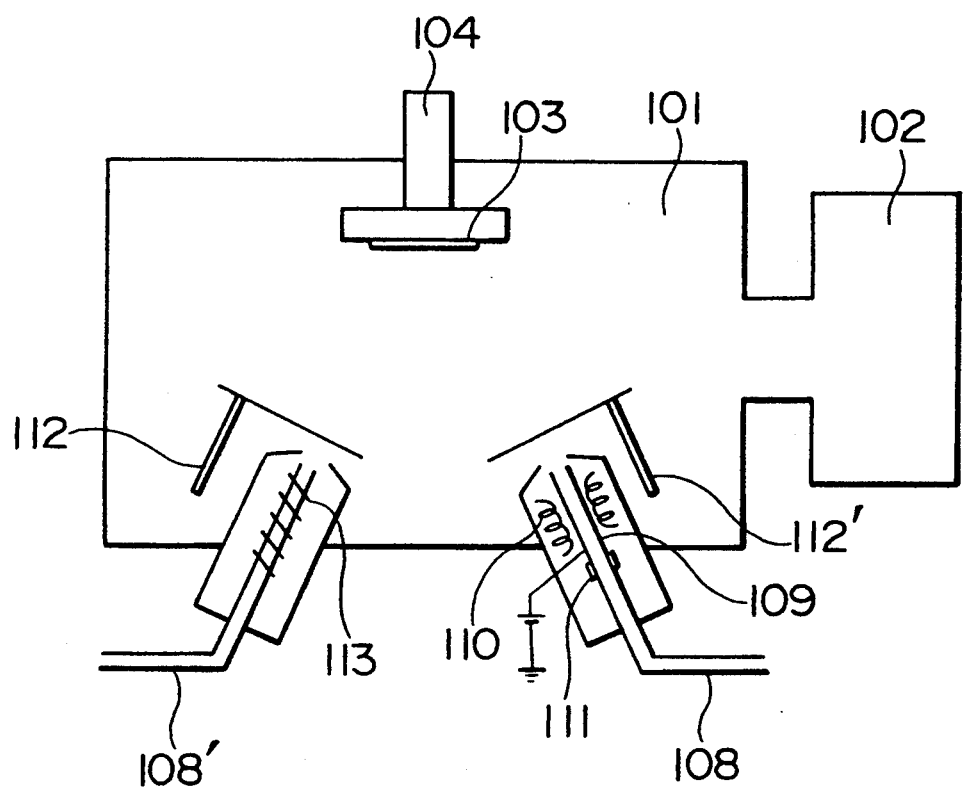
FIG. 7 is a schematic view showing another example of an etching apparatus for the practice of the present invention.

FIG. 7 shows another example of an etching apparatus using cracking of a selenide gas such as a hydrogen selenide gas, a diethyl selenide gas, etc., where a hydrogen selenide gas, a diethyl selenide gas, or the like is introduced through a gas inlet pipe 108' and cracked by a heater 113 to form selenium molecular beams. Other functions of the etching apparatus and method for using the apparatus are the same as given with reference to FIG. 5.

Figure 8:
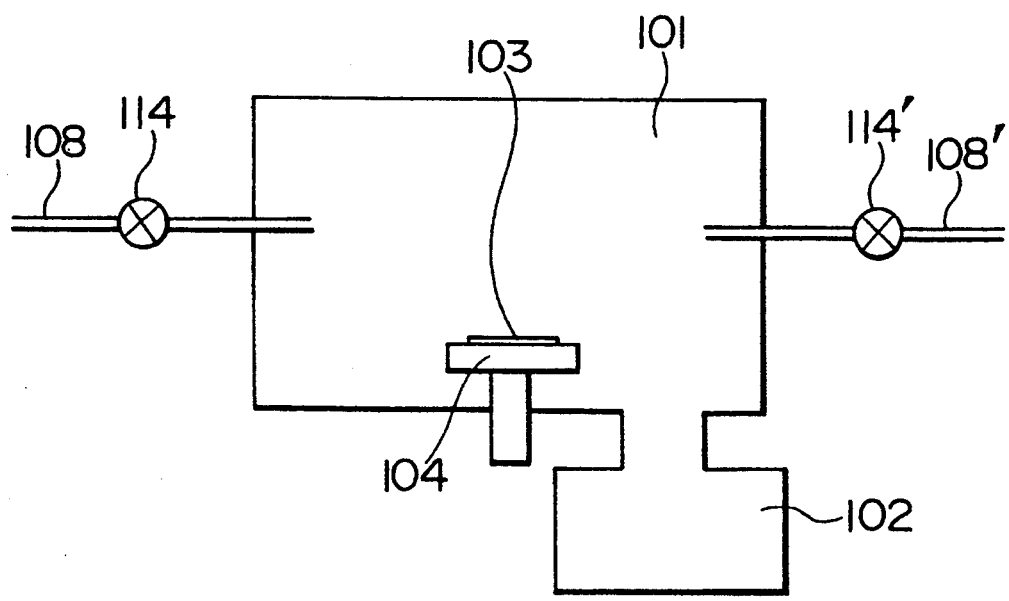
FIG. 8 is a schematic view showing another example of an etching apparatus for the practice of the present invention.

FIG. 8 shows other example of an etching apparatus having mechanisms for introducing a hydrogen selenide gas or a diethyl selenide gas and a reducing gas such as a hydrogen gas or a chlorine gas. At first, a hydrogen selenide gas or a diethyl selenide gas is introduced into a vacuum chamber 101 through a gas inlet pipe 108' to form a compound layer composed of a selenide on a heated compound semiconductor substrate 103 supported on a substrate support 104. Then, the valve 114' is closed and the remaining gas is evacuated from the vacuum chamber by an evacuating unit 102, and then a reducing gas such as a hydrogen gas, a chlorine gas or the like is introduced through another gas inlet pipe 108 to remove the compound layer from the substrate surface. By repetitions of the etching steps, etching can be attained.

Case of forming a compound layer composed of a sulfide on the substrate surface can be carried out likewise, where sulfur molecular beams, a hydrogen sulfide gas or their energetical beams, or an aqueous ammonium sulfide solution can be used. In this case a layer of Group III element sulfide is formed only up to a thickness of a few monoatomic layers, and thus etching can be carried out with as good a controllability as that in case of forming a selenide layer. Removal of sulfide can be carried out with a reducing gas such as hydrogen radicals, a hydrogen gas, a chlorine gas, etc.

Case of forming a compound layer composed of a telluride on the substrate surface can be carried out likewise.

In the foregoing, a case of etching gallium arsenide has been explained. This can be also applied to other compound semiconductors such as indium phosphide, indium gallium arsenide, aluminum gallium arsenide, etc.

EXAMPLE 2

The present invention will be explained in this Example, referring to FIGS. 2A and 2B.

Figure 2B:
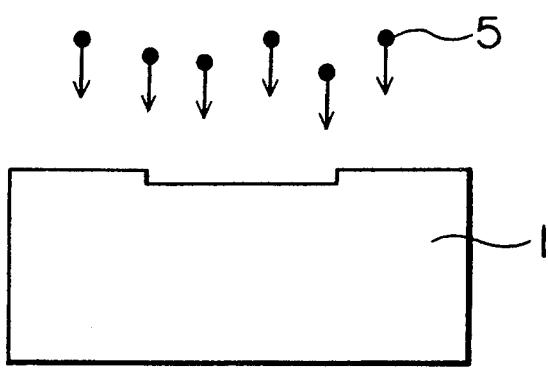

At first, narrowly focussed selenium ion beams 7 are irradiated onto desired positions on a gallium arsenide substrate 1 heated to about 400° C. to form a compound layer 4 composed mainly of gallium selenide on the substrate surface (FIG. 2A). Then, the substrate surface is exposed to hydrogen radicals 5 to remove the compound layer 4 therefrom (FIG. 2B). By repetition of these etching steps, etching can be attained to a desired etching depth.

In Example 1, specific regions of compound semiconductor are etched by using the solid layer 2 as a mask, whereas in this Example the selenide is locally formed by selenium ion beams, and thus it is not necessary to form a mask layer.

Figure 9:
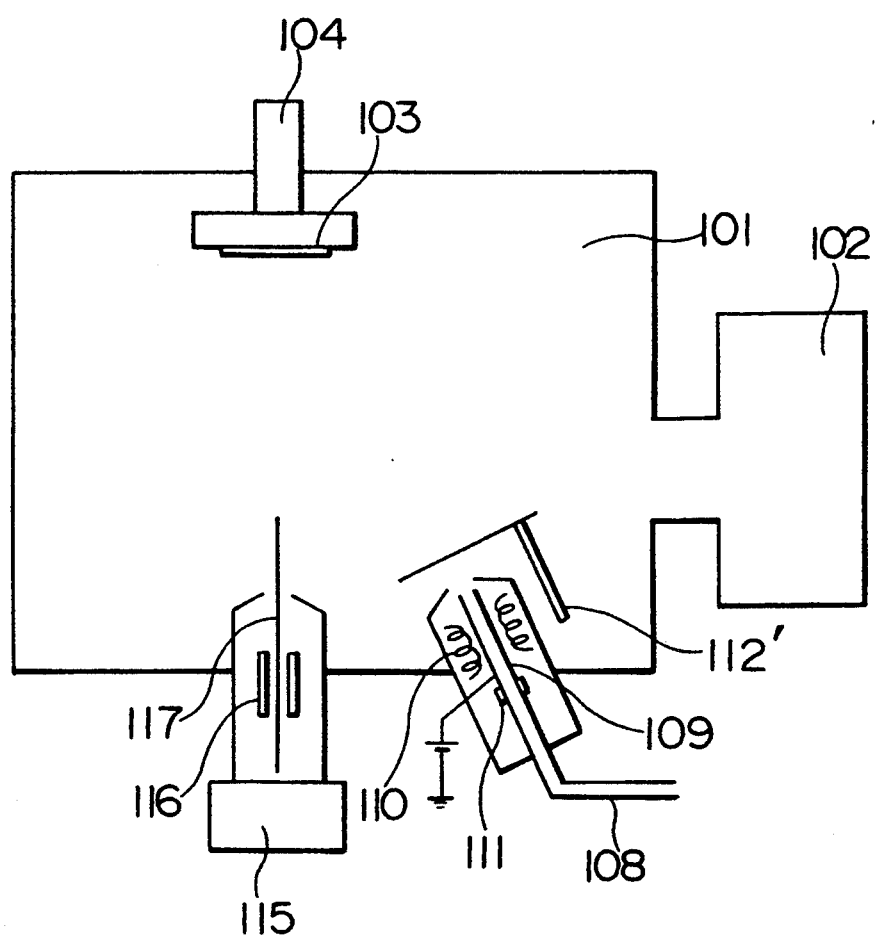
FIG. 9 is a schematic view showing a further example of an etching apparatus for the practice of the present invention.

FIG. 9 schematically shows an etching apparatus for use in this Example, where focussed ion beams 117 composed of selenium ions generated by and emitted from an ion source 115 are scanned by a potential applied to deflecting plates 116 and allowed to hit desired regions on a substrate 103, thereby forming a compound layer in the desired regions. Then, a shutter 112' is opened to irradiate hydrogen radical beams onto the substrate. Mechanism and functions of a hydrogen radical generator comprising members 108, 109, 110 and 111 are the same as already explained, referring to FIG. 7.

In the foregoing, irradiation of selenium ion beams for the formation of compound layer 4 and treatment with hydrogen radicals for the removal of the compound layer are carried out alternately. It is possible to conduct selenium ion beam irradiation while exposing the substrate to the hydrogen radical atmosphere. In that case, formation and removal of the compound layer can be simultaneously carried out, and thus the time required for the etching can be shortened.

In the foregoing, formation of a selenide layer as a compound layer on the substrate surface has been explained. Etching can be likewise carried out in cases of forming a selenide layer and a telluride layer. Not only hydrogen radicals, but also a reducing gas such as a hydrogen gas, a chlorine gas, etc. or their energetical beams can be used for the removal of the compound layer.

EXAMPLE 3

Figure 3A:
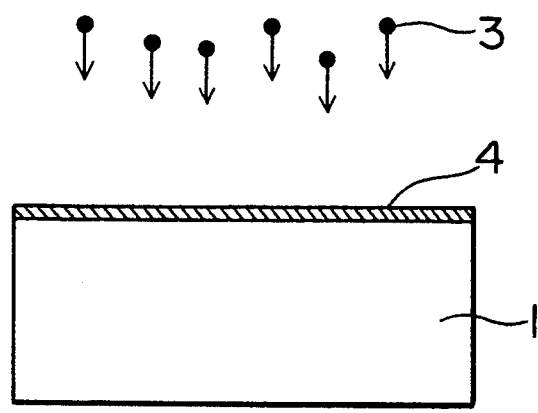
FIGS. 3A and 3B are cross-sectional views showing etching steps according to Example 3 of the present invention.
Figure 3B:
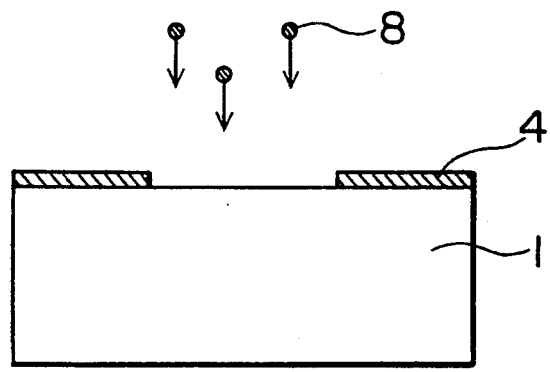

The present invention will be explained in this Example, referring to FIGS. 3A and 3B. At first, selenium molecular beams 3 are irradiated onto the surface of a gallium arsenide substrate 1, heated to about 400° C., to form a compound layer 4 composed mainly of gallium selenide (FIG. 3A). Then, narrowly focused hydrogen ion beams are irradiated onto desired regions on the substrate to remove the compound layer 4 (FIG. 3B). By repetitions of these etching steps etching can be attained to a desired etching depth. It is also not necessary to form a mask layer on the substrate surface in this Example, as in Example 2.

Figure 10:
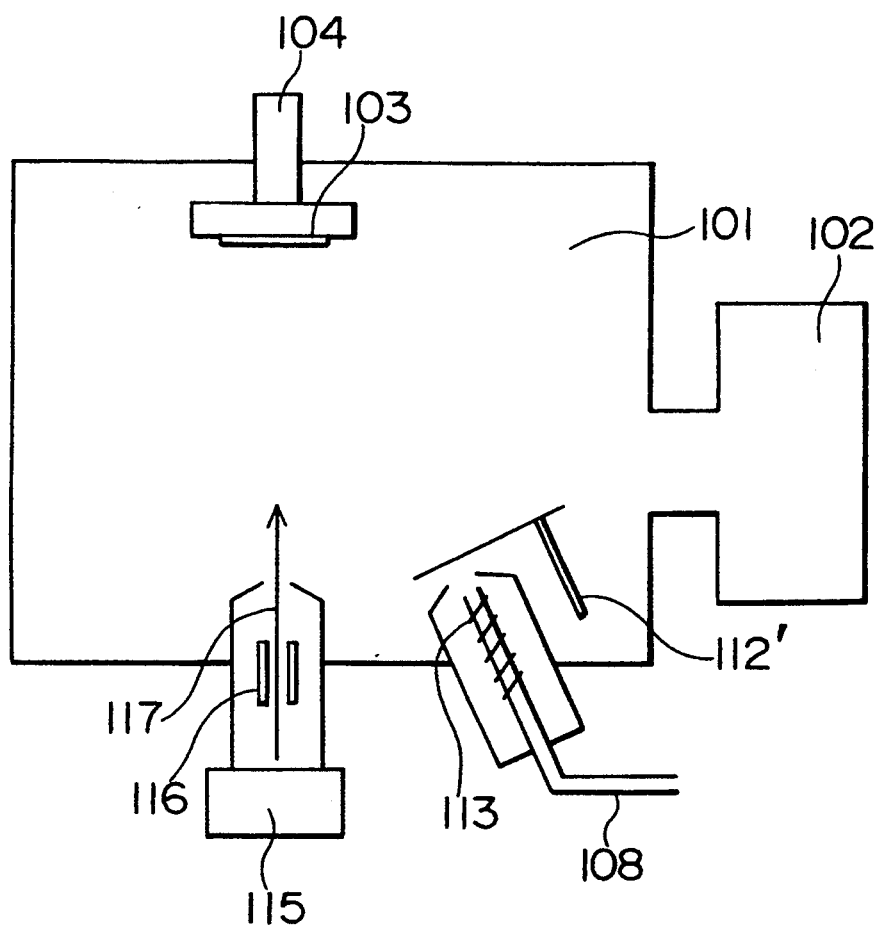
FIG. 10 is a schematic view showing a still further example of an etching apparatus for the practice of the present invention.

FIG. 10 schematically shows an etching apparatus for use in this Example. At first, a shutter 112' is opened to irradiate selenium molecular beams onto a substrate 103, thereby forming a compound layer composed of selenide on the substrate surface. Then, the shutter 112' is closed. In this etching apparatus, the selenium molecular beams are formed by cracking a selenide gas such as a hydrogen selenide gas or the like, introduced through a gas inlet pipe 108, by a heater 113. Selenium molecular beams obtained by heating solid selenium can be also used in the present invention.

Then, focussed ion beams 117 composed of hydrogen ions, generated from an ion source 115, are scanned by deflecting plates 116 and allowed to hit desired regions on the substrate 103 to remove the compound layer from the desired regions. By repetition of these etching steps, etching can be attained to a desired etching depth.

In the foregoing, irradiation of selenium molecular beams for the formation of compound layer 4 and treatment with focussed hydrogen ion beams for the removal of the compound layer are alternately carried out. It is possible to conduct irradiation of focussed hydrogen ion beams onto the substrate while exposing the substrate to a selenium atmosphere. In that case, formation and removal of the compound layer 4 are carried out at the same time, and thus the time required for etching can be shortened.

Not only the focussed hydrogen ion beams, but also focussed ion beams of a reducing gas such as a chlorine gas, etc. can be used likewise for the removal of the compound layer 4.

Figure 11:
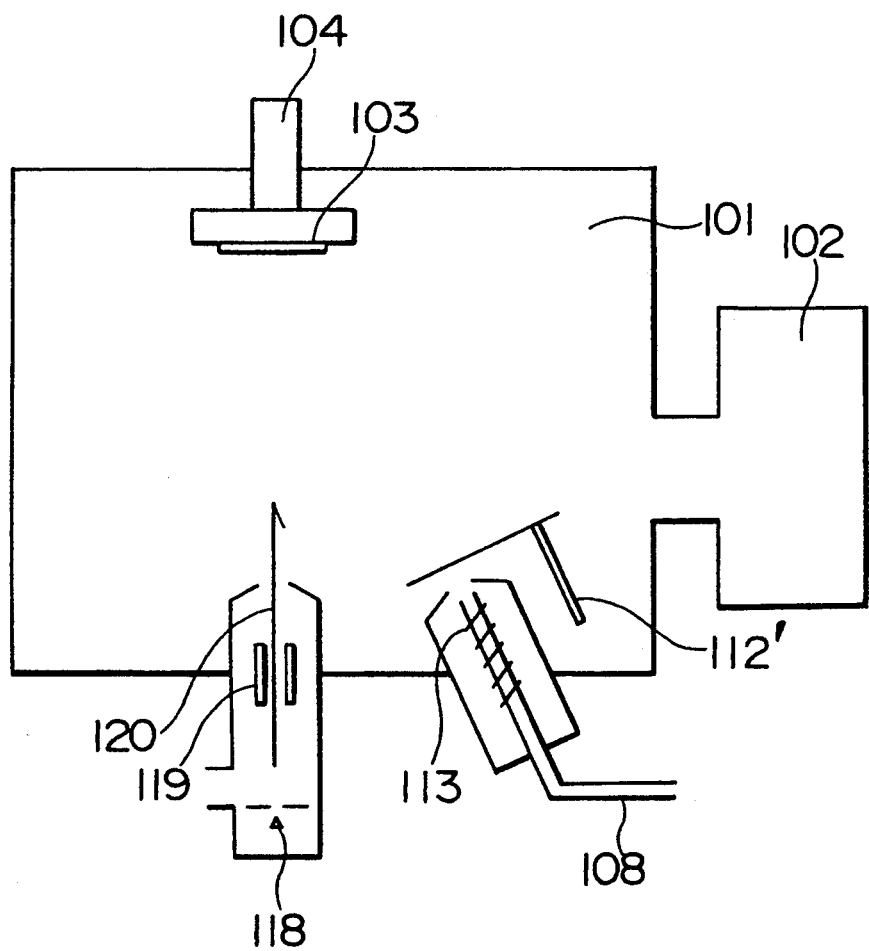
FIG. 11 is a schematic view showing a still further example of an etching apparatus for the practice of the present invention.

Electron beams can be also used for the removal of the compound layer 4. An etching apparatus for this case is schematically shown in FIG. 11, where electron beams 120 obtained from an electron beam source 118 comprising a filaments and a lens are scanned by deflecting plates 119 and irradiated onto desired positions on a substrate surface 103 and the compound layer can be removed from the substrate surface by energies given by the electron beams. When there is a sufficient amount of hydrogen generated during the cracking of a selenide gas introduced through a gas inlet pipe 108 by a heater 113, reaction between the hydrogen adsorbed on the compound layer surface and the compound layer is induced by electron beam irradiation, and thus removal of the compound layer can be much accelerated. A reducing gas such as a hydrogen gas can be intentionally introduced into a vacuum chamber 103 for this purpose.

In the foregoing, explanation has been made as to the case of forming a selenide layer as a compound layer on the substrate surface. This can be also applied to cases of forming a sulfide layer and a telluride layer.

EXAMPLE 4

A method for producing a field effect type, transistor of compound semiconductor using a two-dimensional electron gas as a channel, that is, the so called HEMT (high electron mobility transistor), according to the present invention, will be explained in this Example, referring to FIGS. 4A to 4D.

At first, an undoped gallium arsenide layer 11, an n-type aluminum gallium arsenide layer 12, and an n-type, gallium arsenide layer 13 are made to grow successively on a semi-insulating gallium arsenide substrate 10 by molecular beam epitaxy (FIG. 4A), where the thickness of the n-type, aluminum gallium arsenide layer 12 is 300 Å. Then, an n+type, gallium arsenide layer 14 is made to grow thereon by a selective growth method to form low resistance source and drain regions, and furthermore side walls 15 composed of silicon oxide or the like is formed on the side surfaces of the layer 14 (FIG. 14B).

Figure 4A:
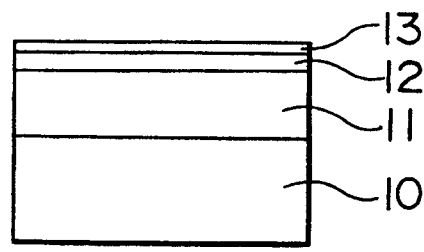
FIGS. 4A to 4D are cross-sectional views showing steps for producing a field effect type transistor of compound semiconductor according to Example 4 of the present invention.
Figure 4B:
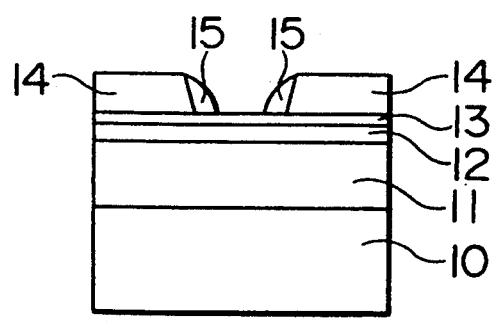
Figure 4C:
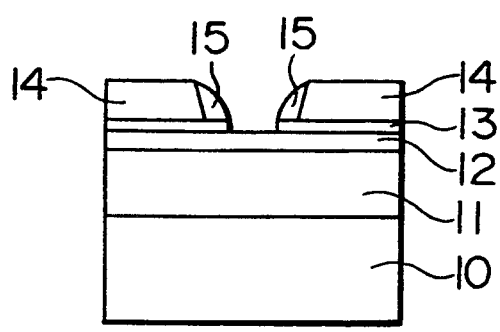

Then, the n-type gallium arsenide layer 13 at the openings is etched using the side walls 15 and the n+type gallium arsenide layer 14 as masks. The etching is carried out by alternate irradiation of selenium molecular beams at a flux intensity of 1E-6 Torr and hydrogen radicals at a substrate temperature of about 400° C. (FIG. 4C).

Figure 4D:
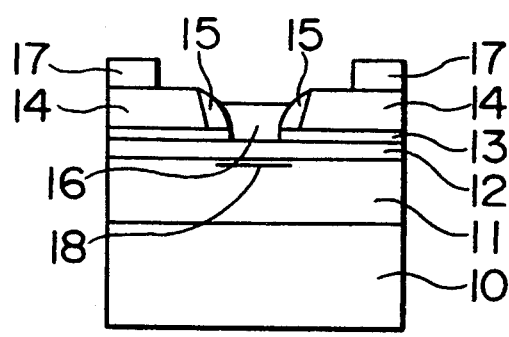

Then, gate electrodes 16 are formed at the openings and source and drain electrodes 17 are formed on the n+type, gallium arsenide layer 14 to complete a field-effect type transistor (FIG. 4D). The length each of the gate electrodes is 0.5 μm.

In the transistor of such a structure as given above, the gate electrodes 16 are in contact with the n-type aluminum gallium arsenide layer 12, and the concentration of a two-dimensional electron gas 18 induced at the interface between the n-type aluminum gallium arsenide layer 12 and the undoped gallium arsenide layer 11 is adjusted by the bias of the gate electrodes 16, whereby the current passing between the source and drain electrodes is controlled, that is, transistor functions can be obtained.

The n-type gallium arsenide layer 13 is retained below the side walls 15 without complete removal so as to reduce the parasitic resistance between the gate electrodes and the source and drain electrodes and attain accelerated working of the device.

The threshold voltage, the gate voltage at which the drain current is pinched off, is a function of a distance between the gate electrodes 16 and the two-dimensional electron gas 18. Thus, in case the regions under the gate electrodes are etched, as in the present transistor of such a structure as given above, the etching depth must be precisely controlled to obtain an uniform threshold voltage. Furthermore, the threshold voltage is changed or the electron mobility is reduced even when a damage is given to the lower part of the semiconductor, and it is necessary to minimize such a damage. The present invention is effective in that case, and transistors of distinguished properties can be obtained.

When the etching of the regions for the gate electrodes is carried out by the conventional reactive ion etching as a comparative example, the variance of threshold voltage on a 2-inch substrate surface is 0.5 V, whereas in the present invention it can be improved to 0.2 V, and transistors having distinguished properties, for example, a transconductance of 400 mS/mm, can be obtained.

The n-type gallium arsenide layer 13 below the gate electrodes 15 may be retained, for example, to a thickness of about 30 Å without complete removal, whereby the readily oxidizable aluminum gallium arsenide layer can be prevented from exposure to the surface. In the conventional reactive ion etching process it has been necessary to interrupt etching at the interface between the gallium arsenide layer and the aluminum gallium arsenide by utilizing such a property that the etching rate of aluminum gallium arsenide is lower than that of gallium arsenide, that is, the so called selectivity, thereby improving the reproducibility of etching depth. Thus it has been difficult to retain the gallium arsenide layer without complete removal. In the present invention, on the other hand, the etching rate can be precisely controlled and thus the gallium arsenide layer can be retained without complete removal.

Furthermore, when the repetitions of etching steps are ended by formation of the selenide layer, a chemically stable surface with a low defect level can be obtained, as disclosed in Proceedings of the Seventeenth International Symposium on Gallium Arsenide and Related Compounds, Jersey, 1990, institute of Physics Conference Series Number 112, p. 111. Thus, fluctuations in the characteristics such as Schottky barriers, etc. can be reduced when gate electrodes are formed on the surface.

In the foregoing, explanation has been made of formation of selenide by irradiation of selenium molecular beams. Selenide gases, such as a hydrogen selenide gas, a diethyl selenide gas, etc., or their cracked gases can be likewise used. Not only hydrogen radicals, but also a reducing gas such as a hydrogen gas, a chlorine gas, etc. can be used for the removal of the compound layer.

This can be also likewise applied to case of forming a compound layer composed of sulfide on the surface, where sulfur molecular beams, a hydrogen sulfide gas, an aqueous ammonium sulfide solution, etc. can be used. In this case, only a few monoatomic layers of Group III element sulfide are formed, and thus etching can be carried out with a good controllability, as in the case of forming a selenide. This can be also likewise applied to a case of forming a compound layer composed of telluride.

In the foregoing, explanation has been made of the case of field effect type, transistor using a two-dimensional electron gas induced at the interface between the aluminum gallium arsenide and the gallium arsenide as a channel. This can be also likewise applied to transistors with an impurity-doped channel region, and also likewise applied to other species of compound semiconductors such as indium phosphide, indium gallium arsenide, etc.

EXAMPLE 5

The present invention will be explained on a method for producing a bipolar transistor of compound semiconductor, referring to FIGS. 5A to 5D.

At first, a collector layer 21 composed of n-type gallium arsenide, a base layer 22 composed of p-type gallium arsenide, and an emitter layer 23 composed of n-type aluminum gallium arsenide are made to successively grow on a semi-insulating gallium arsenide substrate by molecular beam epitaxy, and then an emitter electrode 24 is formed thereon (FIG. 5A), where the thickness of the base layer 22 is 20 nm and that of the emitter layer 23 is 100 nm.

Figure 5A:
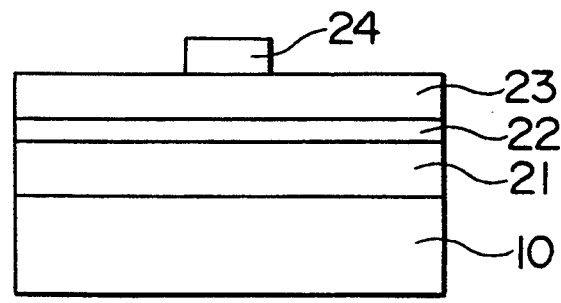
FIGS. 5A to 5D are cross-sectional views showing steps for producing a bipolar transistor of compound semiconductor according to Example 5 of the present invention.
Figure 5B:
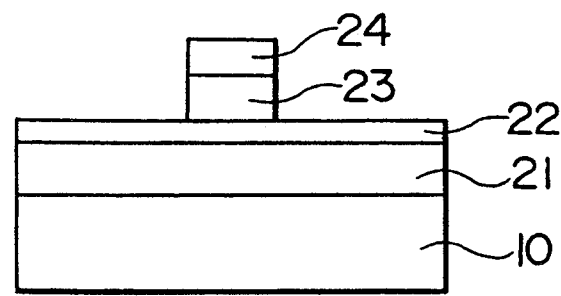

Then, the emitter layer 23 is etched using the emitter electrode 24 as a mask (FIG. 5B). The etching is carried out by alternate irradiation of selenium molecular beams at a flux intensity of 1E-6 Torr and hydrogen radicals at a substrate temperature of about 400° C.

Figure 5C:
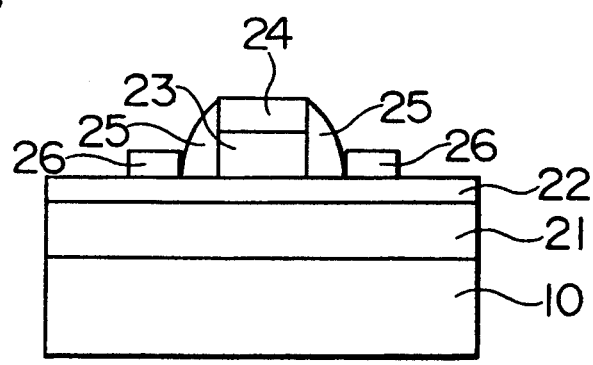

Then, side walls 25 composed of an insulator are formed on the side surfaces of emitter electrode 24 and emitter layer 23, and then base electrodes 26 are formed (FIG. 5C).

Figure 5D:
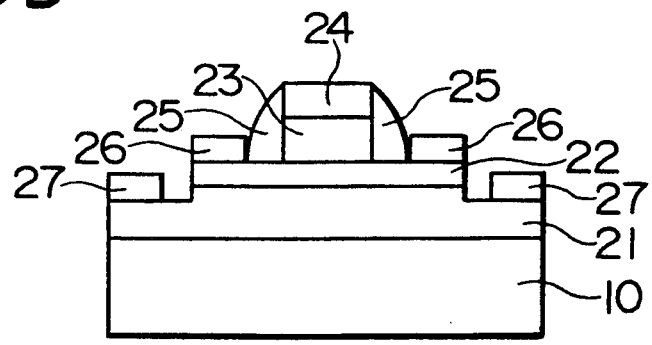

Finally, the peripheral base layer 22 is removed to expose the collector layer 21, and collector electrodes 27 are formed to complete a bipolar transistor (FIG. 5D).

In the etching of the emitter layer 23 in the foregoing process, it is necessary to strictly control the etching depth and end the etching when the base layer 22 is exposed, because the contact resistance of base electrodes 25 will be increased when the emitter layer 23 is retained or when the base layer 22 is thinner to the contrary. It is also desirable to reduce damages to the surface. In the present invention, the etching of the emitter layer 23 can be precisely carried out with less damages, thus allowing emitter electrodes with a low contact resistance to be formed in good yield In the foregoing, explanation has been made of the case of forming a selenide by irradiation of selenium molecular beams. A selenide gas such as a hydrogen selenide gas, a diethyl selenide gas, etc. or their cracked gases can be likewise used. Not only hydrogen radicals, but also a reducing gas such as a hydrogen gas, a chlorine gas, etc. can be used for the removed of the compound layer. This can be also likewise applied to a case of forming a compound layer composed of a sulfide on the surface, where sulfur molecular beams, a hydrogen sulfide gas, an aqueous ammonium sulfide solution, etc. can be used. In that case, only a few monoatomic layers of Group III element sulfide are formed, and thus etching can be carried out with a good controllability, as in the case of selenide. This can be also likewise applied to a case of forming a compound layer composed of telluride.

In the foregoing, explanation has been made of the case of a bipolar transistor comprising aluminum gallium arsenide and gallium arsenide. This can be also likewise applied to cases of other compound semiconductors such as indium phosphide, indium gallium arsenide, indium aluminum arsenide, indium gallium arsenide phosphide, etc.

EXAMPLE 6

A method for producing a field effect type transistor of compound semiconductor using a two-dimensional gas as a channel, that is, the so called HEMT (high electron mobility transistor), will be explained in this Example, referring to FIGS. 12A to 12E.

Figure 12A:
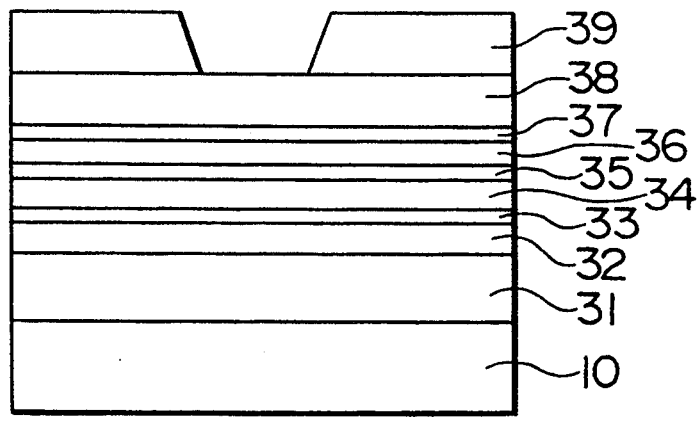
FIGS. 12A to 12E are cross-sectional views showing steps for producing a field effect transistor of compound semiconductor according to Example 6 of the present invention.
Figure 12B:
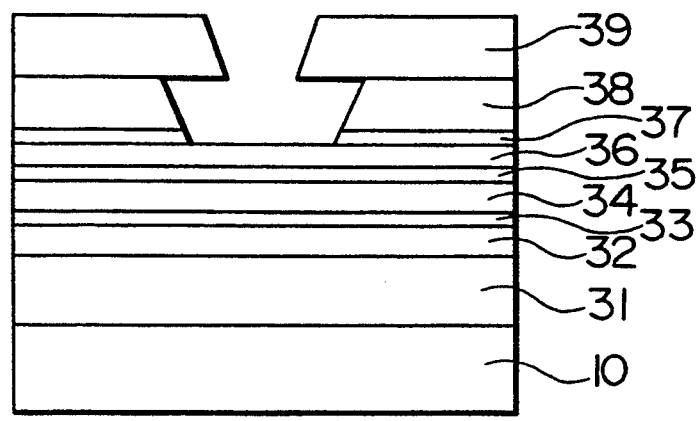

At first, an undoped gallium arsenide layer 31, an undoped indium gallium arsenide layer 32, an undoped aluminum gallium arsenide layer 33, an n-type aluminum gallium arsenide layer 34, an undoped aluminum gallium arsenide layer 35, an undoped gallium arsenide layer 36, an undoped aluminum gallium arsenide layer 37, and an n+ type gallium arsenide layer 38 are made to successively grow on a semi-insulating gallium arsenide substrate 10 by molecular beam epitaxy, where the undoped indium gallium arsenide layer 32 is a channel layer having a mixing ratio of indium arsenide crystal of 0.25 and a thickness of 8 nm, and total thickness of the undoped aluminum gallium arsenide layer 33, the n-type aluminum gallium arsenide layer 34 and the undoped aluminum gallium arsenide layer 35 is 27 nm, which corresponds to the depth from the gate electrode to the channel of the completed transistor. Then, a silicon oxide film 39 having an opening pattern at the gate electrode positions is formed on the surface (FIG. 12A). Pattern formation of the silicon oxide film is carried out by the ordinary lithography and plasma dry etching. At first, an opening is formed, and then a silicon oxide film is deposited again on the entire surface, followed by dry etching. A side wall is formed on the initially formed opening to obtain an opening pattern of smaller size. Then, using the silicon oxide film 39 as a mask, the n+gallium arsenide layer 38 is removed by dry etching. The dry etching is carried out in a higher selectivity ratio of gallium arsenide to aluminum gallium arsenide and should be ended at the depth up to the undoped aluminum gallium arsenide layer 37. Even after the etching reaches the undoped aluminum gallium arsenide layer 37, the etching is continued for a while to laterally etch the n+gallium arsenide layer 38. This is to prevent contact with a gate electrode to be formed later. Successive to the etching of the n+gallium arsenide layer 38, the undoped aluminum gallium arsenide layer 37 is removed by wet etching (FIG. 12B).

Figure 12C:
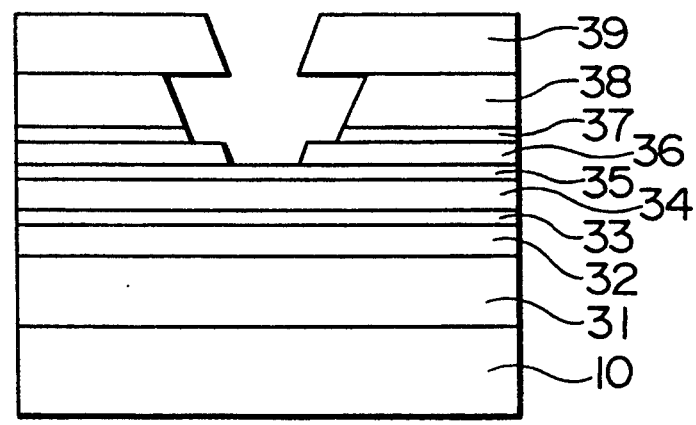

Then, using the silicon oxide film 39 as a mask, the undoped gallium arsenide layer 36 is etched. The etching is carried out by alternate irradiation of selenium molecular beams and hydrogen radicals at a substrate temperature of about 500° C. (FIG. 12C).

Figure 12D:
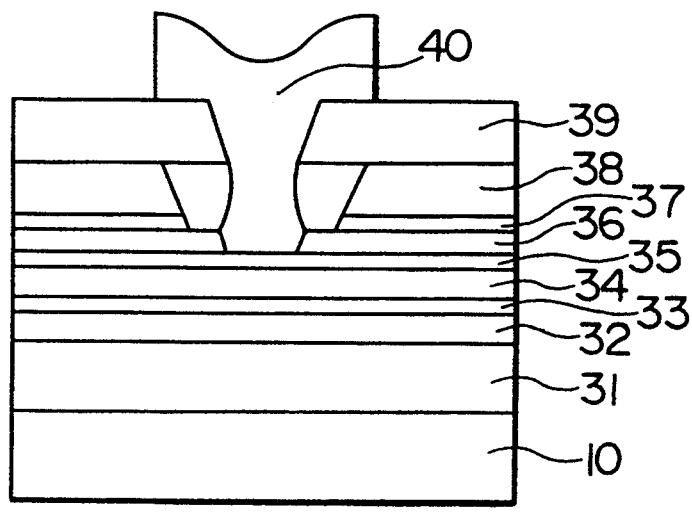

Then, a gate metal film is vapor deposited by a directional vapor deposition process, and the excessive gate metal film is removed by lithography to form a gate electrode 40 (FIG. 12D). The opening length of silicon oxide film 39, direction at the gate metal film vapor deposition, etc. are so adjusted to make the gate length 0.2 μm.

Figure 12E:
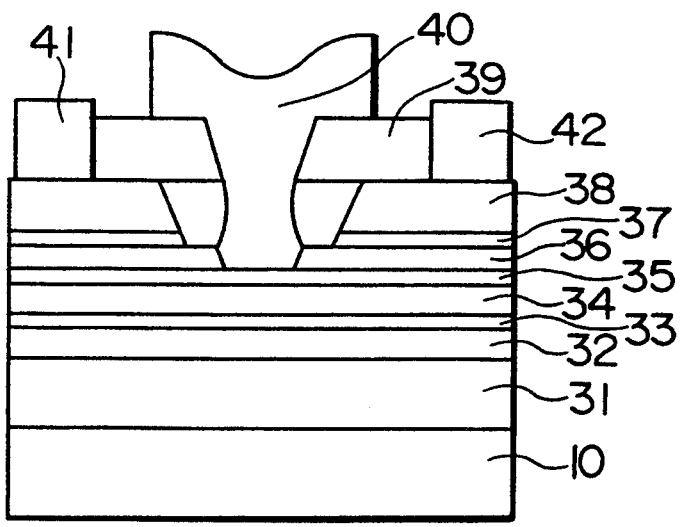

Finally, the silicon oxide film 39 for the regions for source and drain electrodes are removed to form openings, and a metallic film composed of AuGe is formed in the openings, and heated to about 400° C. to alloy the metallic film with the n+gallium arsenide layer 38 below, thereby forming a source electrode 41 and a drain electrode 42 to complete a transistor (FIG. 12E).

The thus obtained transistor is in such a structure that the undoped gallium arsenide layer 36 is provided on the surface between the gate electrode 40 and the n+gallium arsenide layer 38. This structure is to reduce the parasitic resistance between the source electrode and the gate electrode and obtain a high transconductance.

In the step of removing the undoped gallium arsenide layer 36 just below the gate electrode, it is difficult to control the etching depth by the ordinary plasma dry etching. Even when the etching is carried out in a high selectivity ratio of gallium arsenide, the lateral etching extension (so called side etching) fluctuates and thus it is difficult to obtain such a structure that the undoped gallium arsenide layer is retained on the side of the gate electrode. Furthermore, when the etching is carried out under such conditions as high plasma potential and high anisotropy, the surface is highly susceptible to damages by ion impingement, etc., resulting in a decrease in the channel mobility and carrier concentration. In the present invention, on the other hand, that is, by alternate irradiation of selenium molecular beams and hydrogen radicals, there are less damages with easy control of etching depth, and thus transistors with good characteristics can be obtained. That is, the transistors produced in this Example can have a transconductance of 300 mS/mm.

EXAMPLE 7

A method for producing a bipolar transistor will be explained in this Example, referring to FIGS. 13A to 13E.

Figure 13A:
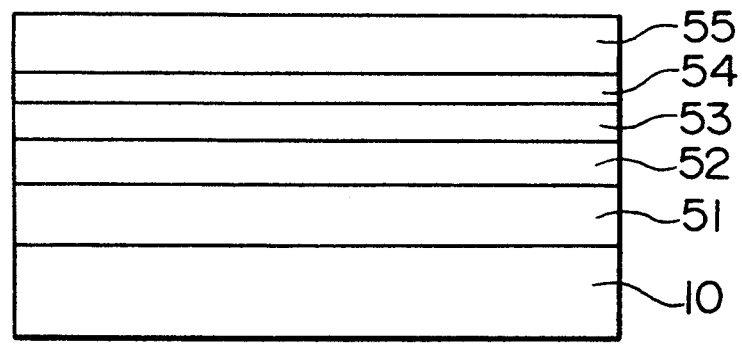
FIGS. 13A to 13E are cross-sectional views showing steps for producing a bipolar transistor of compound semiconductor according to Example 7 of the present invention.

At first, an undoped gallium arsenide layer 51, an n+gallium arsenide layer 52, an n−gallium arsenide layer 53, and a p+gallium arsenide layer are made to successively grow on a semi-insulating gallium arsenide substrate 10 by molecular beam epitaxy, where the thickness of the p+gallium arsenide layer 54 is 40 nm. Then, a tungsten silicide film 55 is deposited as a base electrode material on the surface (FIG. 13A).

Figure 13B:
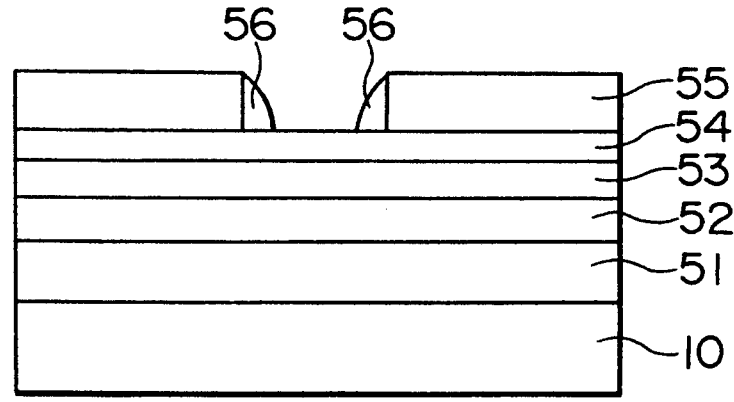

Then, the tungsten silicide film 55 for the region for forming an emitter layer is removed by a plasma dry etching process. Then, a silicon oxide layer is deposited on the surface, and the silicon oxide film is processed by anisotropical plasma dry etching to form side walls 56 on the side surface of the tungsten silicide film (FIG. 13B).

Figure 13C:
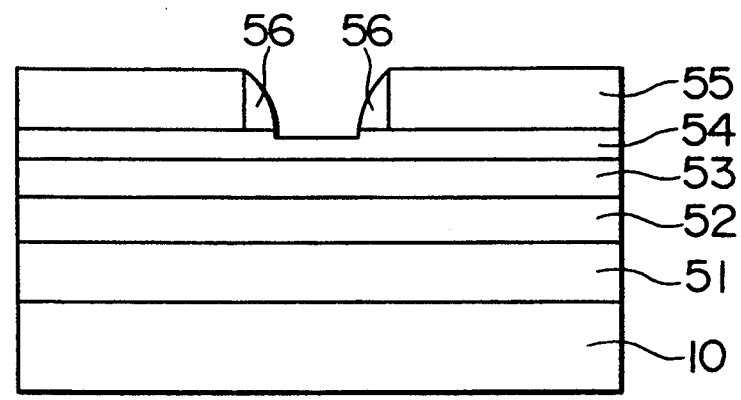

Then, using the tungsten silicide film 55 and the side walls 56 as masks, the surface of the p+gallium arsenide layer 56 is etched (FIG. 13C). The etching is carried out by alternate irradiation of selenium molecular beams and hydrogen radicals at a substrate temperature of about 500° C., where the etching depth is 10 nm.

Figure 13D:
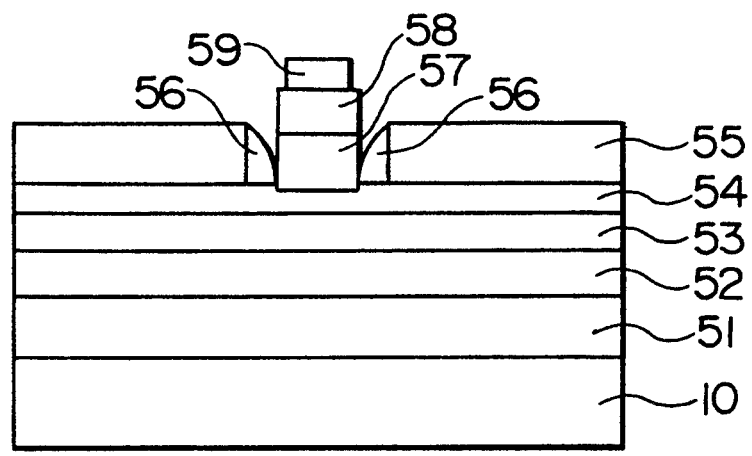

Then, using the tungsten silicide film 55 and the side walls 56 as masks, and an n+aluminum gallium arsenide layer 57 and an n+indium gallium arsenide layer 58 are made to selectively and successively grow on the etched surface of the p+gallium arsenide layer 54, and then an emitter electrode 59 is formed on the surface of the n+indium gallium arsenide layer 58 (FIG. 13D).

Figure 13E:
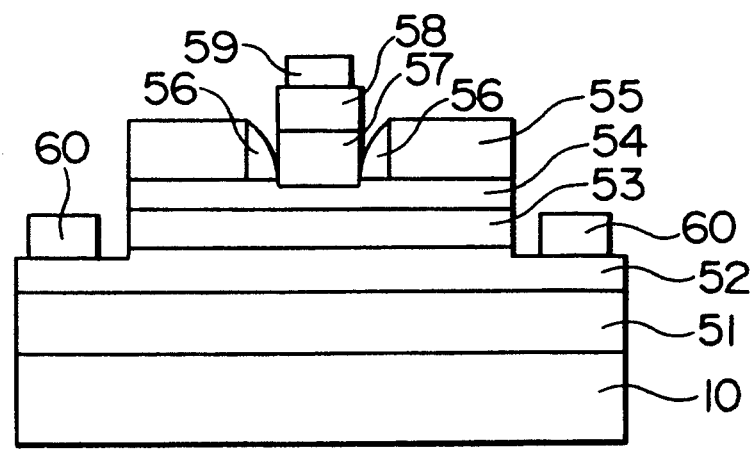

Finally, the peripheral tungsten silicide film 55, the p+gallium arsenide layer 54 and the n−gallium arsenide layer 53 are removed to expose the n+gallium arsenide layer 52, and collector electrodes 60 are formed thereon to complete a bipolar transistor (FIG. 13E).

In this Example, the etching of the p+gallium arsenide layer is to remove the surface layer damaged during the processing of the tungsten silicide film and the side walls. When the n−aluminum gallium arsenide layer 57 as an emitter layer is made to grow without the etching, defect levels due to the damages are retained at the interface and thus minority carriers diffusing from the emitter into the p+gallium arsenide layer (base layer) undergo recombination at the defect levels, resulting in deterioration of current amplification factor, etc. of the transistor. When the etching is carried out by the conventional wet etching process, it is difficult to control the etching depth, and large fluctuations appear from one wafer to another or on the wafer surfaces. According to the present etching method, the etching depth can be precisely controlled, and thus transistors with good characteristics can be produced with a good reproducibility.

According to the present invention, the etching depth of a compound semiconductor can be controlled not by an etching time, but by the number of runs (repetitions) of steps of alternately exposing the surface of a compound semiconductor to molecular beams, gases or radicals, and thus the controllability and reproducibility of etching depth can be considerably improved.

When the present etching method is applied to the production of semiconductor devices, devices with less fluctuations in the characteristics can be produced with a good reproducibility.

What is claimed is:

1. A method for etching a compound semiconductor, which comprises a step of substituting a constituent element of the compound semiconductor, to be etched, with other element, thereby forming a compound layer having a same crystalline structure as that of the compound semiconductor, on a surface of the compound semiconductor, and a step of removing the compound layer from the surface.

2. The method according to claim 1, wherein the step of forming a compound layer and the step of removing the compound layer are successively repeated at least twice.

3. The method according to claim 1, wherein the step of forming a compound layer and the step of removing the compound layer are carried out simultaneously.

4. The method according to claim 1, wherein the compound layer is partially removed in the step of removing the compound layer.

5. The method according to claim 1, wherein the other element is selected from the group consisting of selenium, sulfur and tellurium.

6. The method according to claim 5, wherein the step of removing the compound layer is carried out by reaction of the compound layer with hydrogen radicals.

7. The method according to claim 1, wherein the constituent element of the compound semiconductor is substituted with the other element in a selected area of the compound semiconductor, the compound layer being removed from said selected area.

8. The method according to claim 8, wherein the step of forming a compound layer and the step of removing the compound layer are successively repeated at least twice.

9. The method according to claim 2, wherein the step of removing the compound layer is carried out by reaction of the compound layer with hydrogen radicals.

10. The method according to claim 9, wherein the other element is selected from the group consisting of selenium, sulfur and tellurium.

11. The method according to claim 1, wherein said substituting is performed by exposing the compound semiconductor to a molecular beam of the other element.

12. The method according to claim 1, wherein said substituting is performed by exposing the compound semiconductor to a gas containing the other element.

13. The method according to claim 1, wherein said substituting is performed by exposing the compound semiconductor to a solution containing the other element.

14. The method according to claim 1, wherein said compound semiconductor is made of a material selected from the group consisting of gallium arsenide, indium phosphide, indium gallium arsenide and aluminum gallium arsenide.

15. The method according to claim 1, wherein the step of substituting including forming a mask on the compound semiconductor, so as to expose a portion of the compound semiconductor, and substituting the other element in the portion of the compound semiconductor.

16. The method according to claim 1, wherein the step of substituting includes selectively exposing a portion of the compound semiconductor to the other element without use of a mask.

17. The method according to claim 1, wherein an entire area of the compound semiconductor is exposed to the other element in the step of substituting, and wherein the step of removing includes removing only a portion of said entire area.

18. The method according to claim 2, wherein, in each of said steps of removing, a same thickness of the compound semiconductor is removed.

19. The method according to claim 18, wherein said same thickness is approximately a bimolecular layer thickness.

20. The method according to claim 1, wherein compound layer has a thickness of a bimolecular layer.

21. A method for etching a compound semiconductor, which comprises a step of substituting a constituent element of the compound semiconductor, to be etched, with other element, thereby forming a compound layer on a surface of the compound semiconductor, the other element being selected from the group consisting of selenium, sulfur and tellurium, and a step of removing the compound layer from the surface.

22. The method according to claim 21, wherein the constituent element of the compound semiconductor is substituted with the other element in a selected area of the compound semiconductor, the compound layer being removed from said selected area.

23. The method according to claim 21, wherein the step of forming a compound layer and the step of removing the compound layer are successively repeated at least twice.

24. The method according to claim 21, wherein the step of forming a compound layer and the step of removing the compound layer are carried out simultaneously.

25. The method according to claim 21, wherein the compound layer is partially removed in the step of removing the compound layer.

26. The method according to claim 20 wherein the step of removing the compound layer is carried out by reaction of the compound layer with hydrogen radicals.

27. The method according to claim 21, wherein the step of removing the compound layer is carried out by reaction of the compound layer with hydrogen radicals.

28. The method according to claim 9, wherein the step of removing the compound layer is carried out by reaction of the compound layer with hydrogen radicals.

* * * * *